(12) United States Patent
Camarota et al.

(10) Patent No.: US 7,550,994 B1
(45) Date of Patent: Jun. 23, 2009

(54) PROGRAMMABLE LOGIC DEVICE WITH ON-CHIP NONVOLATILE USER MEMORY

(75) Inventors: Rafael C. Camarota, Sunnyvale, CA (US); Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/668,325

(22) Filed: Jan. 29, 2007

Related U.S. Application Data

(63) Continuation of application No. 10/754,432, filed on Jan. 9, 2004, now Pat. No. 7,190,190.

(51) Int. Cl.
*G06F 7/38* (2006.01)
*H03K 19/173* (2006.01)

(52) U.S. Cl. .............................. 326/38; 326/37; 326/41; 716/16

(58) Field of Classification Search ............. 326/37–41, 326/47, 8; 716/16
See application file for complete search history.

(56) References Cited

U.S. PATENT DOCUMENTS

| | | | |
|---|---|---|---|
| 6,076,149 A * | 6/2000 | Usami et al. ................. | 711/163 |
| 6,212,639 B1 * | 4/2001 | Erickson et al. ............... | 726/26 |
| 6,538,468 B1 * | 3/2003 | Moore .......................... | 326/40 |
| 7,190,190 B1 * | 3/2007 | Camarota et al. .............. | 326/38 |
| 2003/0020512 A1 * | 1/2003 | Mantey et al. ................. | 326/38 |
| 2005/0097499 A1 * | 5/2005 | Sun et al. ...................... | 716/16 |

* cited by examiner

*Primary Examiner*—Rexford Barnie
*Assistant Examiner*—Dylan White
(74) *Attorney, Agent, or Firm*—Townsend and Townsend and Crew LLP

(57) ABSTRACT

A programmable logic integrated circuit has user-accessible nonvolatile memory for use by the programmable logic. In a specific embodiment, the programmable logic integrated circuit has a programmable logic array portion and a nonvolatile memory array portion. The nonvolatile memory array portion is segregated into a boot data part and a user data partition. The boot data partition holds data for configuring the programmable logic portion on power up, and the user data partition is for use by the programmable logic. A user can store and retrieve data from the user data partition. A built-in oscillator can be programmably connected from the nonvolatile memory portion to the PLD portion.

28 Claims, 7 Drawing Sheets

PROGRAMMABLE LOGIC DEVICE WITH ON-CHIP NONVOLATILE USER MEMORY

CROSS-REFERENCES TO RELATED APPLICATIONS

This application is a continuation of U.S. patent application Ser. No. 10/754,432, filed Jan. 9, 2004, the disclosure of which is incorporated herein by reference.

BACKGROUND OF THE INVENTION

The present invention relates to the field of integrated circuits and in particular, to a integrated circuit having a programmable logic array portion with volatile configuration memory and a nonvolatile memory array portion.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit.

Modern programmable logic integrated circuits incorporate programmable logic including logic gates, products terms, or look-up tables. Some programmable logic integrated circuits also included embedded user-programmable memory or RAM. However, this RAM is volatile, which means once power is removed from the integrated circuit, the contents of the RAM are lost.

Despite the success of programmable logic, there is a continuing desire to provide greater functionality in a programmable logic integrated circuit, but at the same time, provide greater performance. There are many applications for programmable logic with nonvolatile configuration memory where it is desirable to store on-chip data which is retained even when power is removed from the chip.

For example, it may be desirable to store user parameters such as radio channel presets or telephone number presets. It may be desirable to store system parameters such as interrupt address maps, memory configuration data, IP or port addresses, power supply voltage adjustments, and other similar information. It may be desirable to store manufacturing identification information such as printed circuit (PC) board revision numbers, firmware revision numbers, product identification, and other similar information.

Therefore, there is a need to provide a programmable logic integrated circuit having user-accessible nonvolatile memory for user memory.

BRIEF SUMMARY OF THE INVENTION

The invention is a programmable logic integrated circuit with user-accessible nonvolatile memory for use by the programmable logic. In a specific embodiment, the programmable logic integrated circuit has a programmable logic array portion and a nonvolatile memory array portion. The nonvolatile memory array portion is segregated into a boot data partition and a user data partition. The boot data part holds data for configuring the programmable logic portion on power up, and the user data partition is for use by the programmable logic. A user can store and retrieve data from the user data partition.

The general addition of nonvolatile user memory embedded in a programmable logic device allows user's to reduce the complexity of their board design. The cost of a programmable logic device with nonvolatile memory would be less than the cost of a programmable logic device and a discrete nonvolatile memory device. There are also manufacturing advantages. In manufacturing the programmable logic device needs to be programmed, and all discrete nonvolatile memory devices need to be programmed. More devices take more time and more complex test equipment. A programmable logic device with nonvolatile memory would centralize the programmable logic and nonvolatile memory manufacturing programming, thus saving time and test equipment resources.

In an embodiment, the invention is an integrated circuit having a programmable logic array portion, including logic array blocks and programmable interconnect configurable using volatile memory elements to implement user functions. There is a nonvolatile memory portion of the integrated circuit, connected to the programmable logic array portion. The nonvolatile memory portion includes nonvolatile memory elements in a boot data portion to store configuration data for configuring the programmable logic array portion upon power-up of the integrated circuit and a user data portion to store user data.

In another embodiment, the invention is a method of operating a programmable integrated circuit including after providing power to the programmable integrated circuit, transferring configuration data from a nonvolatile memory portion of the programmable integrated circuit to configure a programmable logic array portion of the programmable integrated circuit. During a normal operation mode of the programmable integrated circuit, data stored in a user data partition of the nonvolatile memory portion of the programmable integrated circuit is retrieved for use by the programmable logic array portion.

In another embodiment, the invention is a a programmable integrated circuit including a programmable logic array block having programmable logic configured using volatile memory elements, an input/output block to input or output data, and an input/output multiplexer connected between the programmable logic array block and the input/output block, there is a nonvolatile memory array block having a number of nonvolatile memory cells partitioned into a boot data partition and a user data partition and an interface block, connected between the nonvolatile memory array block and the input/output multiplexer, giving the user data partition access to input or output signals on the programmable logic array.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
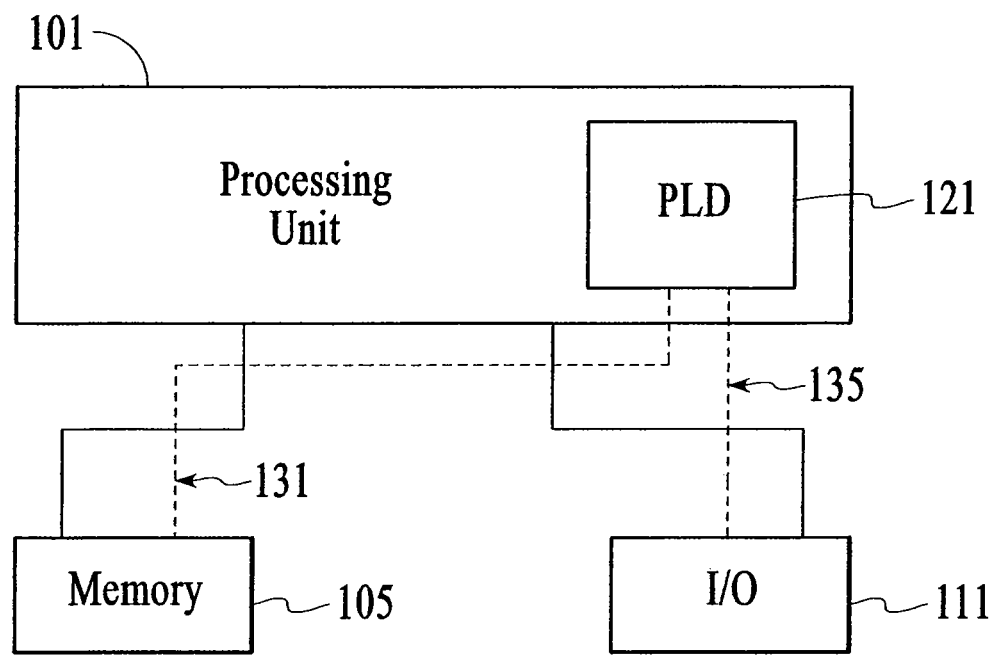
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, Hardcopy™, FLEX®, APEX™, and STRATIX™ series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
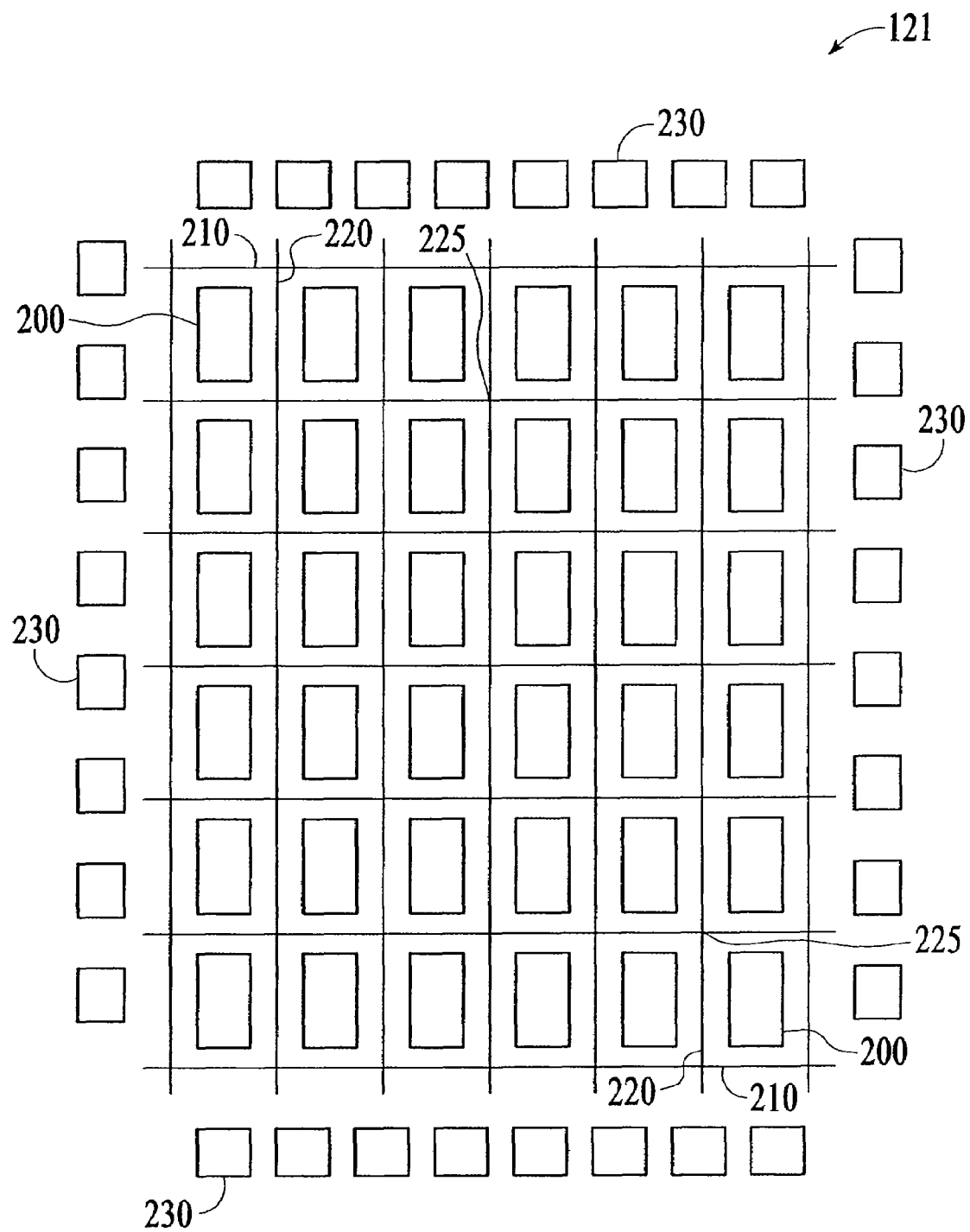
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
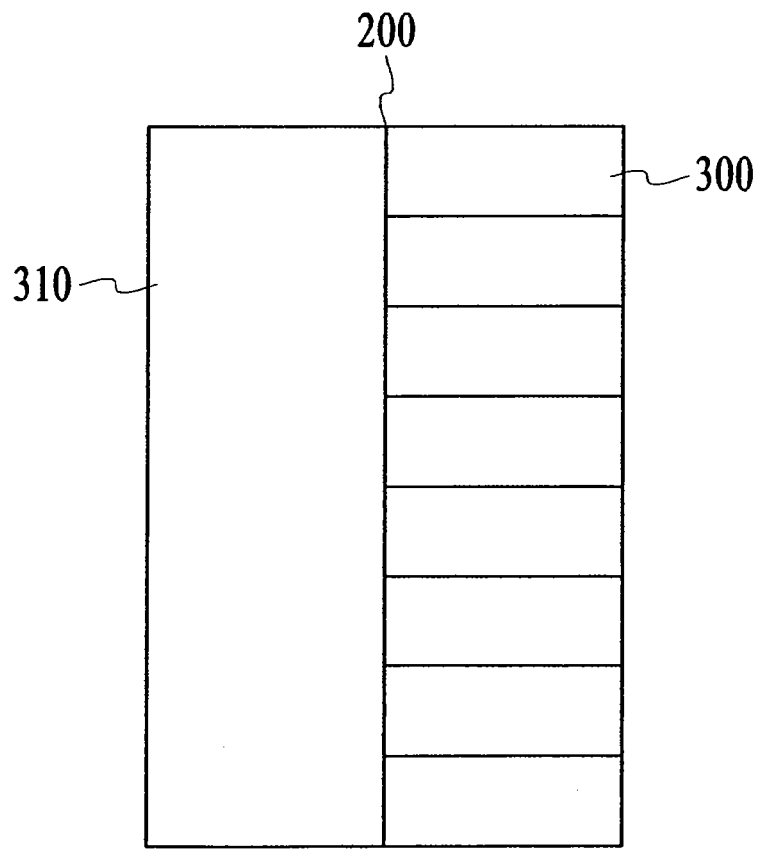
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
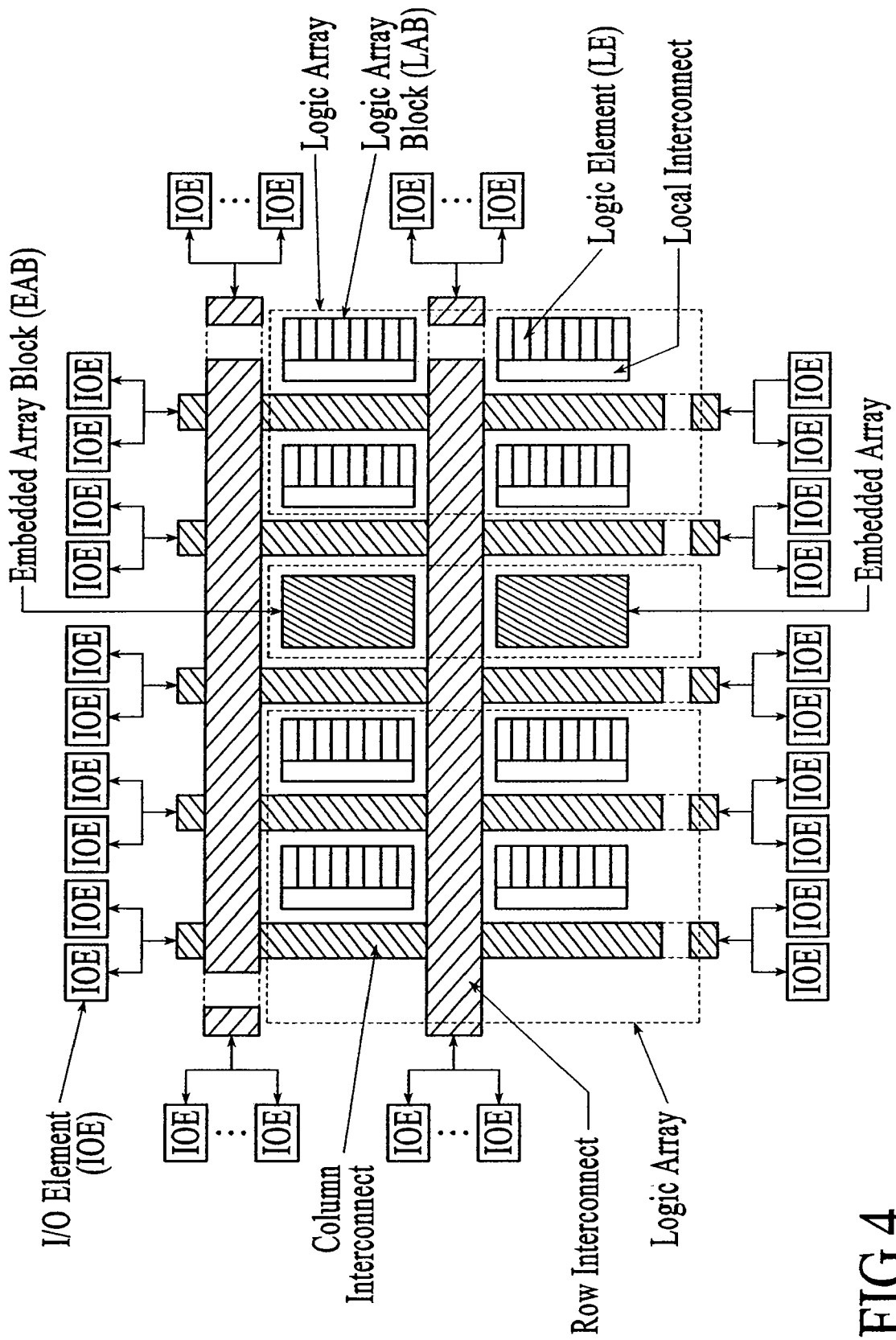
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10 K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX™ family of products are described in detail in the their respective data sheets, available via the Internet at www.altera.com.

Some programmable logic integrated circuits are configured by using on-chip nonvolatile memory cells such as EEPROM, EPROM, Flash, other floating gate or nonvolatile memory element technology, FRAM, MRAM, or polysilicon and metal fuses. Some examples of such devices are Altera's Classic, FLEXLogic, and MAX series of devices. Some integrated circuits are configured using on-chip volatile memory cells such as static RAM (SRAM) memory element technology. Some examples of such devices are Altera's FLEX and APEX series of devices.

Nonvolatile memory devices retain their configuration even when power is removed from the integrated circuit. In comparison, volatile devices lose their programming when power is removed. Therefore, for the SRAM-based and other similar devices, these programmable logic integrated circuits need to be configured on power up. One technique of programming these devices is to store the configuration information in a nonvolatile device such as a serial EPROM with nonvolatile memory. Upon power-up, the configuration data from the serial EPROM integrated circuit is transferred to configure the programmable logic integrated circuit. As long as power is supplied to the volatile programmable logic integrated circuit, the device will retain its programming and needs not be reprogrammed or refreshed.

Figure 5:
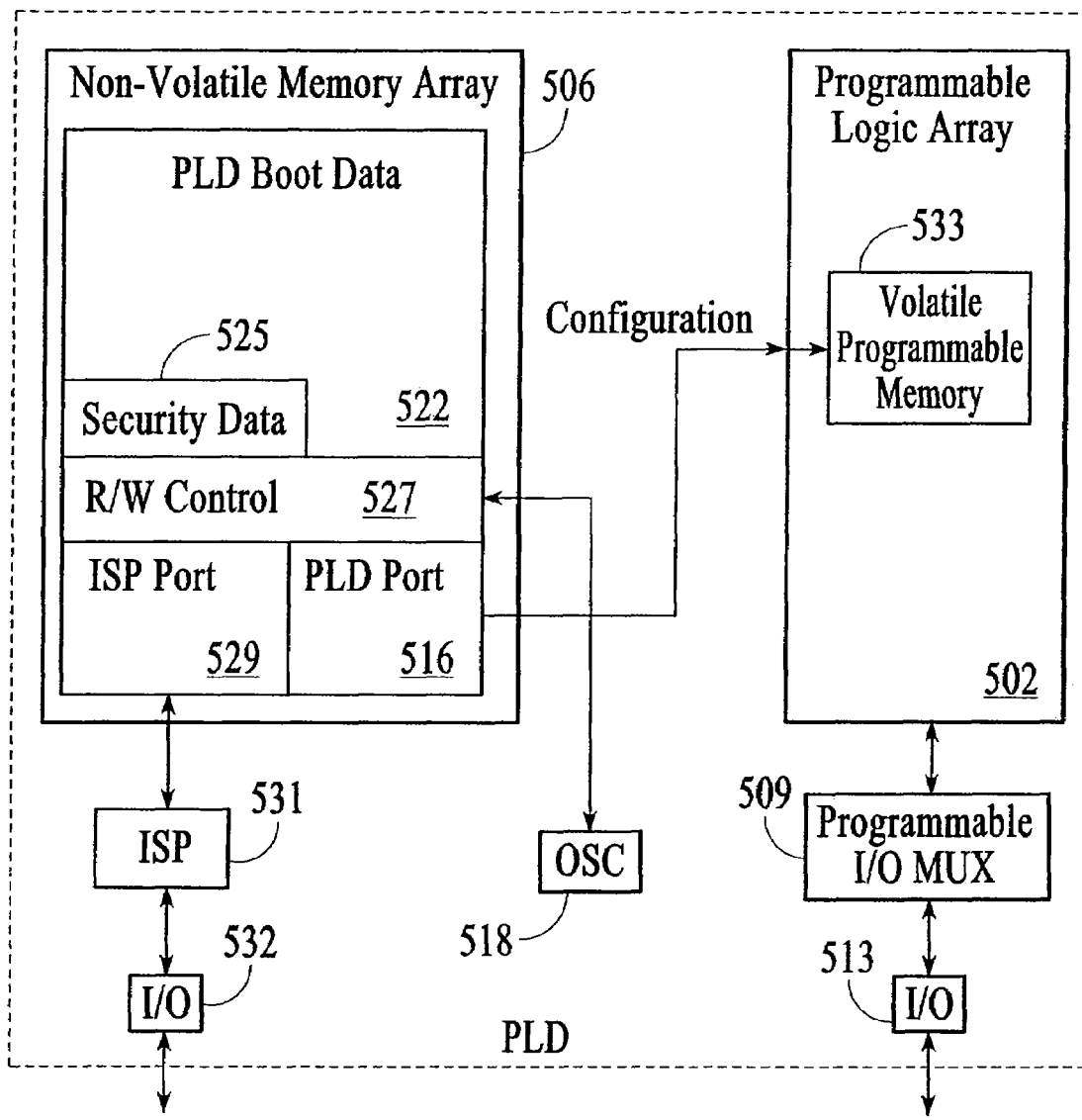
FIG. 5 shows a block diagram of a programmable logic integrated circuit with an embedded nonvolatile memory array.

FIG. 5 shows a programmable logic integrated circuit having a programmable logic array portion 502 and a nonvolatile memory array 506. Both portions reside on the same integrated circuit substrate. The programmable logic array portion uses volatile memory technology. The nonvolatile memory array has nonvolatile memory cells such as EEPROM, Flash, other floating gate or nonvolatile memory element technology, FRAM, MRAM, or polysilicon and metal fuses to store configuration information. The configuration information in the nonvolatile memory portion may be used to configure the logic of the programmable logic array portion upon power up.

Programmable logic array 502 has inputs and outputs to a programmable I/O multiplexer or mux 509. The programmable I/O multiplexer connects selected programmable array nets to external I/O transceivers 513. The programmable logic array also has an input from a nonvolatile memory (NVM) PLD port 516. In an specific implementation, this read-only port transfers nonvolatile memory data to the volatile programmable logic array memory and its volatile programmable memory (VPM) 533 at power up. An oscillator block (OSC) 518 generates a clock for the transfer of data from the NVM to the VPM 533 at power up. The OSC has an input to enable and disable it to save power. When the oscillator is not running, power is saved.

The nonvolatile memory array has various parts: (1) PLD boot data 522 is an array of nonvolatile memory cells. (2) Security data 525 is a special set of nonvolatile bits used to disable in-system programming (ISP) read access. (3) R/W control 527 is the high voltage and analog circuits used to read and write the memory bits. (4) ISP port 529 is the digital access to the nonvolatile data. (5) PLD port 516 is a second read-only digital access to the nonvolatile data.

In a specific embodiment, the ISP and PLD access ports to the nonvolatile memory data are asymmetric. The PLD port is read only and very wide. It is wide to reduce power-up configuration time. The ISP port has a narrower word width that is more efficient for ISP programming. An ISP block 531 connects the nonvolatile memory to the ISP JTAG pins 532 for program and verify of the nonvolatile memory. The ISP block will restrict reading of the configuration data if appropriate security bits are set. This allows a user to protect and secure the user's configuration data.

Figure 6:
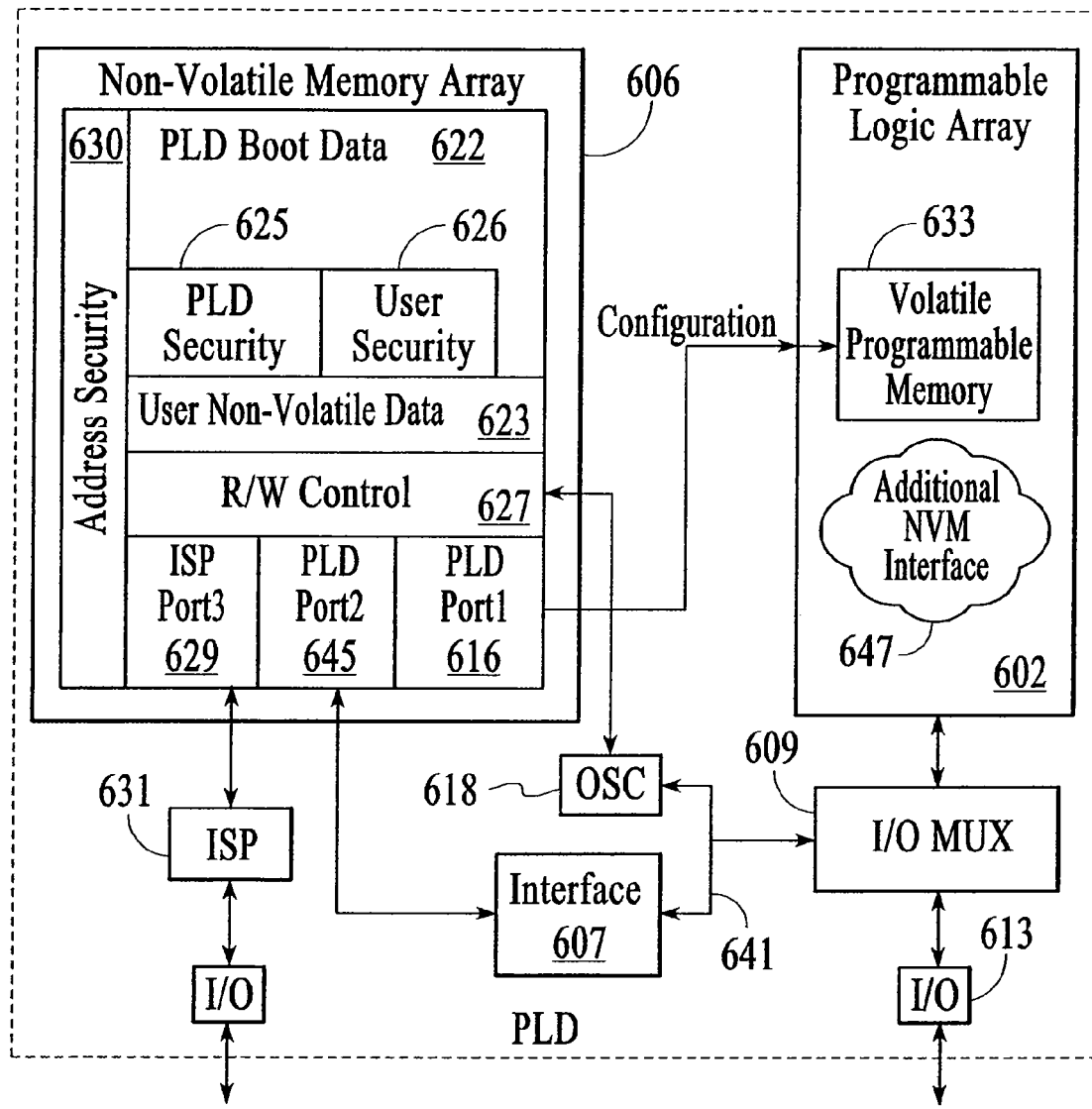
FIG. 6 shows a block diagram of a programmable logic integrated circuit with an embedded nonvolatile memory array having a user-accessible interface to and from the programmable logic array.

FIG. 6 shows another embodiment of a programmable logic integrated circuit having a programmable logic array portion 602 and a nonvolatile memory portion 606. This embodiment is similar to that in FIG. 5, but additionally has another interface 607 with access through programmable I/O multiplexer 609 to programmable logic array 602 and I/O pins 613. This interface permits a user to program and retrieve (by way of the programmable logic) information from the nonvolatile memory. The user may also store information into the nonvolatile memory for later retrieval. The user nonvolatile data partition of the nonvolatile memory is accessible during the normal operation mode of the programmable integrated circuit, an operating mode when the user functions are being utilized.

A user may use the nonvolatile memory to store information that is important to retain even after power is removed from the integrated circuit. Once power is restored and the programmable logic array portion is configured, the user's logic may retrieve the previously stored information. For example, an application would be network parameters for a router, which the programmable logic integrated circuit is part of. Another application may be storing address book and telephone information for a wireless device.

In the programmable logic integrated circuit of FIG. 6, the nonvolatile memory array is segregated into a PLD boot data partition 622 and user nonvolatile data partition 623. PLD boot data partition 622 is used to store configuration information that is used to configure the programmable logic array portion upon power up. User nonvolatile data partition 623 is used to store user data. There is a nonvolatile memory read/write (R/W) port 627. Address security 630 is added to the segregated nonvolatile memory. There is an interface 607 between the nonvolatile memory and the programmable logic. Programmability is added to the NVM-to-PLD interface. Oscillator 618 access is added to interface block and the PLD through a connection 641. Read security based on data in the user security partition 626 is implemented in ISP block 631.

A memory may typically be divided into words, sectors, pages, and partitions. Generally, words, sectors, and pages are of a fixed size. A number of memory cells in a group or block may be referred to as a partition. A partition size is generally variable, and can be any arbitrary size.

More specifically, the programmable logic array 602 has inputs and outputs to a programmable I/O multiplexer 609. The programmable I/O multiplexer connects selected programmable array nets to external I/O transceivers 613, and connections to the oscillator block 618 and the nonvolatile memory interface block 607. These connections enable the oscillator clock and the nonvolatile memory to connect to the programmable logic array 602 when needed by a user application. The user can access the oscillator to use it in functions with the programmable logic array. For example, the user can use the oscillator to clock data within the programmable logic array portion, from a pin of the integrated circuit to the programmable logic array, between the nonvolatile memory and the programmable logic array. The oscillator may be also used to drive a pin, so it is accessible to off-chip circuits. The user-accessible oscillator provides additional flexibility for implementing user functions and provides additional functionality available to users.

The programmable logic array 602 also has an input from the nonvolatile memory PLD port 1 616. This is a read-only port that transfers nonvolatile memory data to the volatile programmable logic array memory, volatile programmable memory 633, at power up. The oscillator block 618 or OSC generates a clock for the transfer of data from the nonvolatile memory to the volatile programmable memory at power up. The OSC clock is also used by the PLD to NVM interface block to run autonomous control logic to emulate standard product nonvolatile interfaces. The OSC clock can also be used by the additional NVM interface logic in the programmable logic array to run autonomous control logic that augments the ability of the interface block to emulate standard product nonvolatile interfaces. The OSC clock may be used by other application circuits in the PLD unrelated to nonvolatile memory. The OSC has multiple inputs to enable and disable it to save power.

The nonvolatile memory array has various parts. (1) PLD boot data 622 is an array of nonvolatile memory cells for PLD configuration. (2) User nonvolatile data 623 is an array of nonvolatile memory cells for user-memory. (3) PLD security data 625 is a special set of nonvolatile bits used to disable ISP 631 read access of block 622. (4) User security data 626 disables the user NVM read access through the ISP interface 631. (5) R/W control 627 is the high voltage and analog circuits used to read and write the memory bits. (6) JTAG port 3 629 has read and write digital access to the nonvolatile data. (7) PLD port 1 616 is a second digital access to the nonvolatile data. (8) PLD Port 2 645 is a third digital access to the nonvolatile data. (9) Address security block 630 restricts access to memory partitions.

The FIG. 6 embodiment provides for three ports. However in other implementations of the invention, there may be any number of ports, greater or less than three. For example, a single port may be used, but this single port combines function of the three ports in FIG. 6. Other examples include ports 1 and 2 may be combined into a single port, ports 2 and 3 may be combined into a single port, or ports 1 and 3 may be combined into a single port. Furthermore, the functions of the three ports may be divided among more than three ports, such as 4, 5, 6, 7, or 8 ports.

In a specific embodiment, the JTAG and PLD access ports to the nonvolatile memory data are asymmetric. The PLD port 1 is read only and very wide. It is wide to reduce power up configuration time. The JTAG port 3 has a word width that is more efficient for ISP programming. The PLD port 2 is a byte wide read/write access suitable for use by the interface block. Other memory widths are possible such as 1 bit, 16 bits, 18 bits, 24 bits, 32 bits, or other widths. The address security block restricts the access to the data in the nonvolatile memory array. Access is limited based on security bit value and access port used. The ISP block 631 connects the nonvolatile memory to the ISP JTAG pins for program and verify of the nonvolatile memory. The ISP block will restrict reading of the nonvolatile memory partitions if the respective security bits are set. It may also be necessary to restrict the access of the PLD port 2 to only user nonvolatile memory partition addresses.

The interface block converts the byte parallel access to the nonvolatile memory array supported by PLD port 2 to a standard device interface. Typically small nonvolatile memories use serial interfaces such as SPI, I2C, 3-wire, or 2-wire. The interface block is programmable to allow it to support multiple standard interfaces. The interface block converts read, write, and erase instructions from the standard serial interface to signals and timing required by the NVM PLD port 2. The interface conversion state machine uses the free running clock from the OSC block.

Some of the programmable logic array may implement additional NVM interface logic 647. The additional NVM interface would augment the interface block to increase the number of supported user nonvolatile device standards. NVM interface logic 647 may be hardwired into the programmable logic, configured into the programmable logic by configuring the appropriate bits, provided as soft IP core, or any combination of these.

The nonvolatile memory array 606 is segregated in a PLD boot portion and a user nonvolatile memory portion. The nonvolatile memory can be added to any integrated circuit manufactured on an appropriate process technology such as EEPROM or Flash. A typical nonvolatile memory may be programmed in system with a single low supply voltage. This functionality may have considerable circuit overhead such as the circuitry to generate the necessary voltages for programming. Nonvolatile memory bits are typically very small. Overhead circuits for the memory bits such as address decode, read sense amplifiers, high voltage pump circuits, and current and voltage regulation circuits, can consume more integrated circuit area then the memory bits. This is especially true for small 1 K- to 4 K-bit memory devices.

Therefore, the invention provides an advantage by segregating a larger nonvolatile memory array used for PLD boot configuration to have a partition for user memory. A nonvolatile memory system used for PLD power up boot configuration can be segregated into one typically larger block to perform power-up configuration, and one or more additional partitions for user access. So, the cost of the nonvolatile overhead is shared by the user nonvolatile memory (UNVM) and the boot nonvolatile memory (BNVM). Since the BNVM has this circuitry in the first place the incremental cost of the UNVM is only the bit area.

Nonvolatile memory element is added to a volatile PLD architecture. The added nonvolatile memory element of the volatile PLD is used to configure the volatile PLD during power-up boot. Additionally, the nonvolatile memory element portion of the volatile PLD may be segregated to have a nonvolatile memory partition used for power-up boot and a user partition for access by the programmable logic during normal operation of the PLD.

In a specific implementation, a nonvolatile memory R/W port is added to permit reading and writing to the nonvolatile memory. The PLD has a nonvolatile memory used by two different parts of the system, for boot-up use and user use. The BNVM has a port (port 3) used for read, write, and erase. This port is connected to external I/O pins to form an in-system programming interface 631. The BNVM has a second independent read-only access port (port 1) used to configure the PLD during power up. Although the ports are independent, they are not required to be able to work simultaneously.

The UNVM requires the addition of a third read, write, and erase port (port 2). The UNVM port (port 2) facilities the UNVM element to the PLD architecture. In a specific implementation, to make the feature easy to use the UNVM port may have some access restrictions. These restrictions allow the PLD to see only the UNVM partition. The restrictions prevent the PLD application from overwriting the BNVM and the PLD application from reading a secure BNVM data. The UNVM port's word width and address count is appropriate for its use. The memory word width may be different than that used for ISP configuration or boot data transfer. The address word needs to be only as many bits as required by the UNVM. The port would convert this PLD port address to the larger absolute address required by the full nonvolatile memory array.

Address security 639 is added to segregated nonvolatile memory. Security is a major advantage of a programmable logic integrated circuit with a built-in nonvolatile boot memory. It is possible to set a bit in the nonvolatile memory that prevents a competitor from reading a design and counterfeiting it. The BNVM has a bit which can be set to disable read in the address range of the full nonvolatile memory used by the BNVM. The internal only boot access port needs no security.

The PLD NVM interface application can develop its own security approach for the NVM. The security of this application is then protected from bypass by the BNVM security that hides the internal workings of any PLD application. The ISP port has access to all nonvolatile memory address, BNVM, UNVM, or security bits. A security bit restricts ISP port read and write access of the UNVM partition. The combination of the BVNM and the UNVM security bit fully secures the UNVM.

The UNVM has two ports the PLD port (port 2) and the ISP port (port 3). The ISP port access is protected by the user security bit 622 and the PLD port access is protected indirectly by the PLD security bit 625. The nonvolatile memory array has multiple access ports: ISP, boot, and PLD. Each access port has different address restrictions and security bit meanings. Table A below provides a table of memory partition access restrictions by port and provides an example of how the nonvolatile address decode block will work. The rows are different nonvolatile memory partitions. The second column is the port functions, read, program, or erase. The last three columns show the port access to the partitions and functions. Some functions are limited by security bits (i.e., PS* and US*). In a specific embodiment the ISP port could use the IEEE 1149.1 (JTAG) and IEEE 1532 serial protocol for nonvolatile memory read and write.

TABLE A

| Memory Partition | Function | PLD Port 1 (Boot) | PLD Port 2 (PLD) | ISP Port 3 (ISP) |
| --- | --- | --- | --- | --- |
| PLD Boot Data (BNVM) | Read | No | Yes | PS* |
| | Prog/Erase | No | No | Yes |
| User Nonvolatile Data (UNVM) | Read/Prog | Yes | No | US* |
| | Erase | Yes | No | Yes |
| PLD Security Data (PS) | Read | No | No | Yes |
| | Prog | No | No | Yes |
| | Erase | No | No | Yes** |
| User Security Data (US) | Read | No | No | Yes |
| | Prog | No | No | Yes |
| | Erase | No | No | Yes** |

PS* means yes only if PLD security data bit is erased. US* means yes only if user security data bit is erased. Yes** means that an erase of the PS or US bits will force an erase of the respective BNVM or UNVM partitions simultaneously. This makes the integrated circuit secure because a user will not be able to erase one of the security bits to view the boot or user data.

An interface 607 is between the NVM and PLD. In other embodiments, the PLD port of the nonvolatile memory may be directly connected to the PLD architecture. However, in an specific embodiment of the invention, an interface block 607 is between the nonvolatile memory and the PLD architecture. The interface block can be fixed or implemented to be programmable. The raw PLD access port has address signals data in and data out signals and various controls signal including read, write, and erase. A simple 4 K-bit nonvolatile memory might have more than 40 input and output signals. This many signals would be very challenging to connect to PLD routing resources.

One of the reasons for adding the small UNVM is to replace discrete nonvolatile memory customers currently use. Currently customers are forced to use serial EEPROM devices for the same reason. The serial interface reduces the nonvolatile memory pin count. The UNVM in the new PLD would be easiest to use if it behaved like existing standard discrete serial EEPROM devices. These devices get instructions, address, and data serially and generate a serial data output for read instructions. The interface block has two functions: reduce the number of signals introduced to the programmable routing architecture and reproduce familiar nonvolatile serial memory interfaces.

Figure 7:
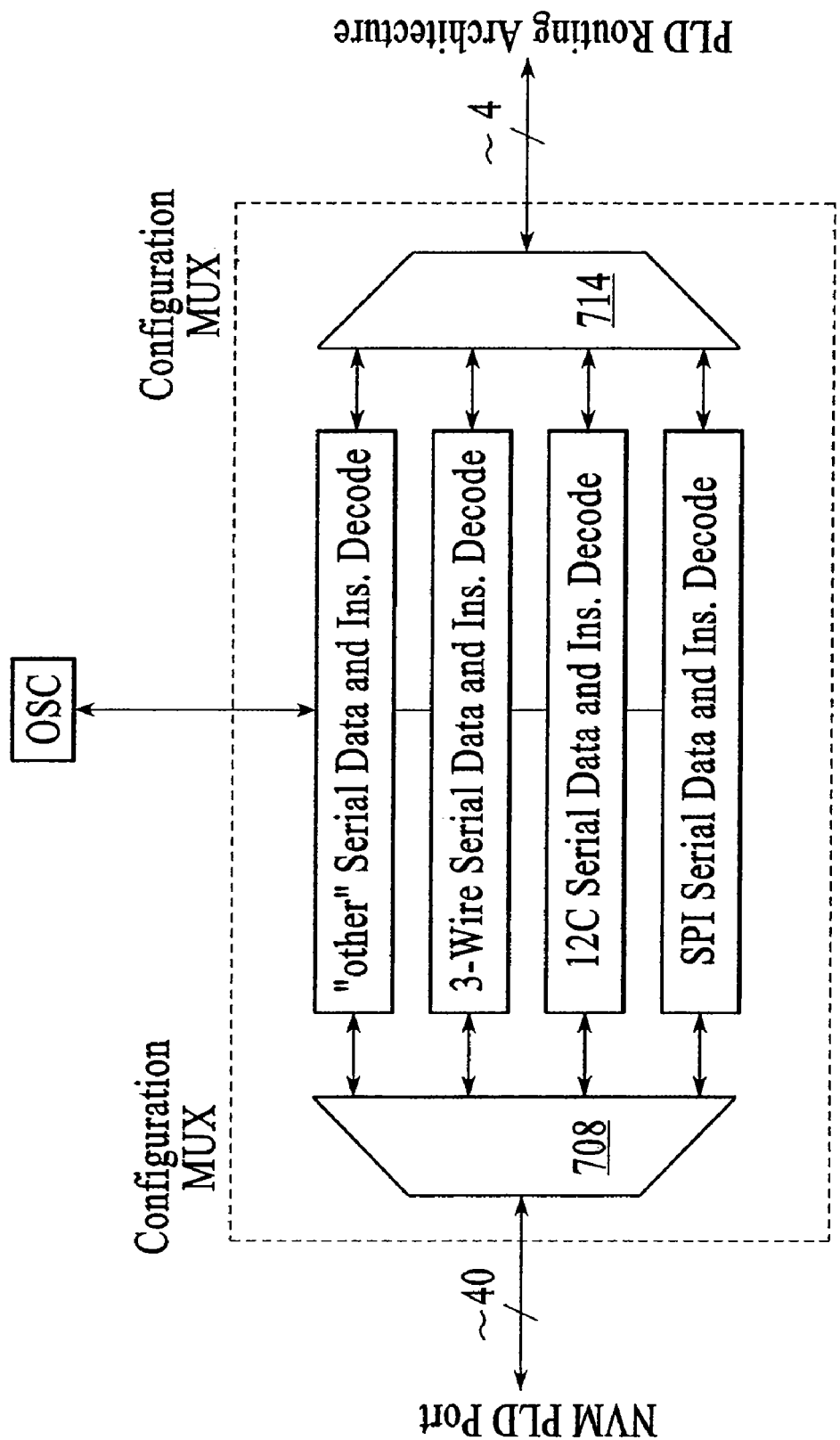
FIG. 7 shows a programmable interface block between the nonvolatile memory and the programmable logic.

FIG. 7 shows an implementation programmability may be added to NVM to PLD interface for additionally flexibility for users. Choosing a single serial EEPROM interface standard to emulate would be very difficult. Users seem evenly divided among four serial standards: SPI, I2C, 3-wire, and 2-wire; and parallel. There are three options for the interface block. First select one interface standard to connect the raw UNVM access port to the PLD. Second, implement multiple interfaces and use BNVM to configure multiplexers to select the one needed by the user application.

An example of the second implementation is shown in FIG. 7. The NVM PLD port has about 40 wires connected to a configuration multiplexer 708. The configuration multiplexer is configured to select one of a number of data interface options as shown. There may be more or fewer options that shown in this figure. Another configuration multiplexer 714 is connected to the PLD via four or more wires. Configuration multiplexer 714 is configured to select one of the number of interfaces. The oscillator OSC is used to clock the data.

A third implementation is for a basic serial-to-parallel and parallel-to-serial interface block with logic to generate self-timed read, write, and erase cycles. The third implementation would be augmented with PLD logic elements and routing to complete standard serial and parallel EEPROM interfaces.

An advantage of the second implementation over the first is that this is very flexible and will address requirements of the majority of users. An advantage of the third over the second is a smaller overhead circuit area and infinite interface options beyond the popular standards. A disadvantage of the third implementation is that it may require PLD LEs, reducing logic density for other applications. The preferred embodiment of our new PLD product with UVNM is the simple interface that is augmented with PLD logic.

Figure 8:
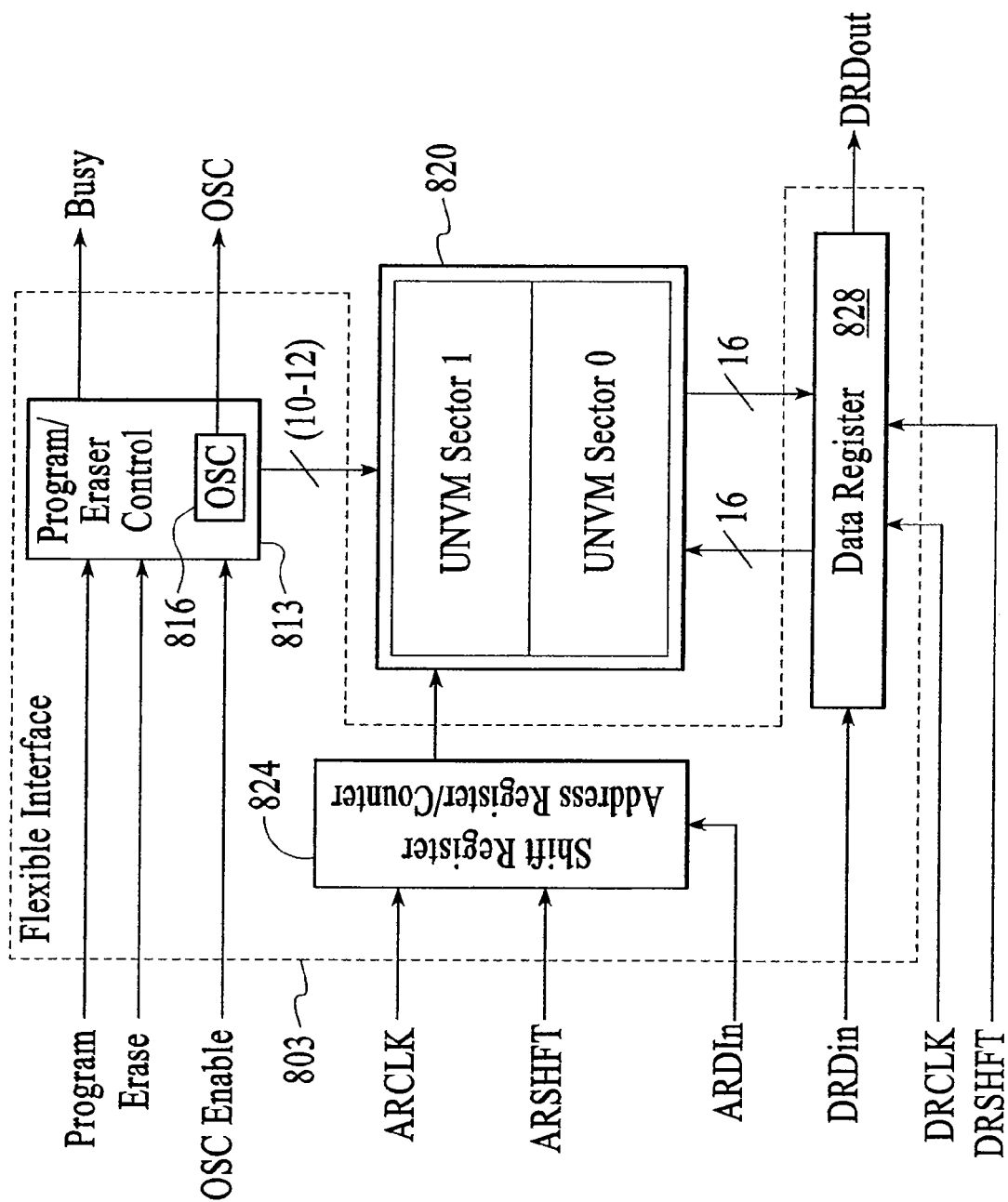
FIG. 8 shows a more detailed diagram PLD of the port 2 block to the nonvolatile memory.

FIG. 8 shows a simple serial interface (PLD port 2) to the user nonvolatile memory. The labeled input and output signals (program, erase, OSC enable, ARCLK, ARSHFT, ARDin, DRDin, DRCLK, DRSHFT, DRDout, busy, and OSC) connect to the PLD routing architecture. This interface block can generate most serial and parallel interface standards if augmented with additional PLD logic. The interface is identified by box 803. The interface includes a program/erase control circuit 813, with oscillator OSC 816. This oscillator may be the same as oscillator 618 but may be separate. If it is the same oscillator, this figure simply shows oscillator 618 as part of port 2 as a specific embodiment. The program/erase control circuit connects to the user nonvolatile memory 820, which is divided into sector 0 and sector 1. There is a shift register 824, which may be used as an address register and counter. There is a data register 828 to hold the data into and out of the user nonvolatile memory.

Oscillator access is permitted from the interface block and PLD. See FIG. 6, connection 641. The power-on configuration process from the BNVM has a clock to run the state machine. The clock is designed as a reasonably accurate free running oscillator that can be gated to stop when not being used to save power. This same clock can be used again in the interface block. A clock is used to perform serial to parallel data conversion and to generate self-timed waveforms into the raw UNVM PLD access port based on serial EERPOM interface instruction decode.

When the serial interface is divided between the PLD logic and interface logic, it is necessary to connect the OSC output clock to the PLD. This clock is for the serial EEPROM interface reproduction, but could be used by many other applications. Therefore the connecting of the OSC output clock to the PLD added for the UNVM has value without the UNVM.

Read security may also be segregated in ISP block. Read security was covered in the UNVM segregation above. In an implementation, this is also a separation of the partitioning of the memory and the independent security of the partitions. The security is segregated to give the user maximum flexibility in implementing applications.

Serial EPROM or serial EEPROM integrated circuits come in many forms and standards are manufactured by Atmel, Philips, ST Micro Electronics, Dallas Maxim, Intel, and many others. These devices come in many sizes. For use with programmable logic, generally users use serial EEPROMs with 32 K bits or less. The "sweet spot" in this market seems to be at 2 K bits. There are various protocols for these parts from industry standards such as SPI and I2C and individual company standards such as 3-wire, 2-wire, I-Button, and others. With a programmable logic integrated circuit with nonvolatile memory of the invention, the data that is stored in serial EEPROMs by users would be stored in the nonvolatile memory portion, BNVM or UNVM. Typically, users use a serial EEPROM to store manufacturing or system configuration information. The configuration information has two sub applications, static system configuration and dynamic system configuration. Another application for UNVM is for storing a manufacturing ID. Customers have a need to electronically identify boards in manufacturing. This is very similar to bar code technology. The electronic serial ID can have both generic and unique information. Most manufacturers have a dedicated connector or assign a set number of edge connector pins to connect directly to the serial EEPROM device. When asked, the board will down load data such as PC board revision, firmware revision, test program revision, product identification, or power requirements, or any combination of these.

In these types of applications all devices in the line have the same EEPROM data value. Going one step further some manufactures put unique information into the serial EEPROM such as manufacture date, sequential board serial number, memory population, port or other feature population, or software security code, or any combination of these. A programmable logic integrated circuit with nonvolatile memory of the invention could be used to store such manufacturing information.

In this application the serial interface is idea because it reduces pin count and cost. The complexity of the protocol is not important because it is not a speed critical function. This electronic serial identification is also used by some users in field service and upgrades. It can be used by a system to identify the board installed and determine its compatibility with the system, before powering it up and enabling it. In this application the serial EPROM or EEPROM has a separate supply which is applied first, so the ID can be read before the main board supplies are enabled. In a specific embodiment, a programmable logic integrated circuit with nonvolatile memory of the invention is used to store such electronic serial identification.

Another application for a UNVM is for storing system parameters. Users have been moving away from dip switches and jumpers to serial EEPROMs to configure their boards. In such a system board configuration, parameters are programmed into the serial EEPROM and then the values in the serial EEPROM are distributed to registers around the board that control system features. Many ASSPs and ASICs have these registers defined but do not have nonvolatile memory and therefore relay on the serial EEPROM the same way an FPGA does. Data from a serial EEPROM might control things like interrupt address map, memory configuration, IP or port address, motor bias current adjustments, laser bias current adjustment, power supply voltage adjustment, analog offset bias adjustment, ASSP or ASIC configuration, MIPs processor configuration, or peripheral address specification (e.g., USB, SCSII), or any combination of these. In a specific embodiment, a programmable logic integrated circuit with nonvolatile memory of the invention is used to store such system parameters.

The use of serial EEPROMs for system parameters are generally divided into two camps. The first has the data as static information, which means it is defined during manufacturing or service. The second has a more complex approach which allows the system to self-update based on operation or user input. The system which allows real-time update most likely has an FPGA or CPLD that handles the complex serial protocol of the serial EEPROM devices. The conceptually simple task of changing an electronic jumper value from 1 to 0 might require a very complex serial data read, erase, and write process. A programmable logic with UNVM as in FIG. 6 would be excellent in such an application. One example of the use of a dynamic system storage parameter would be recording last system reboot time date, recording the number of system power up power down cycles, or even power up fault codes. In a specific embodiment, a programmable logic integrated circuit with nonvolatile memory of the invention is used to store such static system parameters. In a specific embodiment, a programmable logic integrated circuit with nonvolatile memory of the invention is used to store such dynamic system parameters.

User parameters may also be stored in a UNVM. This application is very much like the previous but more related to consumer products. In consumer products that have things like radio channel presets, or telephone number presets, the values for these features are likely stored in serial EEPROMs. In most of these applications, the intelligence to access and change serial EEPROM data is embedded in low cost CMOS ASICs or ASSPs. For these applications the serial EEPROM protocol is critical as it is dictated by predesigned ASICs and ASSPs. In a specific embodiment, a programmable logic integrated circuit with nonvolatile memory of the invention is used to store such user parameters.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An integrated circuit comprising: a programmable logic array portion comprising a plurality of logic array blocks configurable to implement user-defined logic functions; and a nonvolatile memory portion coupled to the programmable logic array portion, wherein the nonvolatile memory portion comprises: a boot data partition to store configuration data; a user data partition to store information to be accessed by an application running on the programmable logic array portion; a first data port for data read access to the boot data partition; and a second data port for data read access to the user data partition.

2. The integrated circuit of claim 1 wherein the programmable logic array portion further comprises volatile memory elements and programmable interconnect, wherein the logic array blocks and programmable interconnect are configurable using the volatile memory elements.

3. The integrated circuit of claim 1 further comprising:
an interface block coupled between the programmable logic portion and the nonvolatile memory portion, the interface block to read information from the user data partition of the nonvolatile memory portion and to write information to the user data partition of the nonvolatile memory.

4. The integrated circuit of claim 3 wherein the interface block provides at least one of an SPI serial data interface, I2C serial data interface, 3-wire serial data interface, 2-wire serial data interface, or parallel data interface to the nonvolatile memory portion.

5. The integrated circuit of claim 3 wherein the interface block comprises:
a first block providing an SPI serial data interface;
a second block providing an I2C serial data interface;
a third block providing a 3-wire serial data interface;
a first multiplexer configurable to select one of the first, second, or third block to a port of the nonvolatile memory portion; and
a second multiplexer configurable to select one of the first, second, or third block to the programmable logic array portion.

6. The integrated circuit of claim 5 further comprising:
a fourth block providing a 2-wire serial data interface; and
a fifth block providing a parallel data interface,
wherein the first multiplexer is configurable to select one of the first, second, third, fourth, or fifth blocks to a part of the nonvolatile memory portion, and
wherein the second multiplexer is configurable to select one of the first, second, third, fourth, of fifth blocks to the programmable logic array portion.

7. The integrated circuit of claim 1 wherein the information is selected from the group consisting of network parameters, address book, and telephone number information.

8. An integrated circuit comprising:
a programmable logic array portion comprising a plurality of logic array blocks configurable to implement user-defined logic functions;
a nonvolatile memory portion coupled to the programmable logic array portion, wherein the nonvolatile memory portion comprises:
a boot data partition to store configuration data;
a user data partition to store user data;
a first data port for data read access to the boot data partition; and
a second data port for data read access to the user data partition; and
an oscillator circuit coupled to the programmable logic array portion and the nonvolatile memory portion, wherein the oscillator circuit comprises an enable input for enabling and disabling the oscillator circuit,
wherein a signal provided by the oscillator circuit clocks transfers of user data from the nonvolatile memory portion to the programmable array portion, and
wherein the programmable logic array portion further comprises volatile memory elements and programmable interconnect, wherein the logic array blocks and programmable interconnect are configurable using the volatile memory elements.

9. The integrated circuit of claim 8 further comprising:
an interface block coupled between the programmable logic portion and the nonvolatile memory portion, the interface block to read data from the user data partition of the nonvolatile memory portion and to write data to the user data partition of the nonvolatile memory.

10. The integrated circuit of claim 9 wherein the interface block provides at least one of an SPI serial data interface, I2C serial data interface, 3-wire serial data interface, 2-wire serial data interface, or parallel data interface to the nonvolatile memory portion.

11. An integrated circuit comprising:
a programmable logic array portion comprising a plurality of logic array blocks configurable to implement user-defined logic functions;
a nonvolatile memory portion coupled to the programmable logic array portion, wherein the nonvolatile memory portion comprises:
a boot data partition to store configuration data;
a user data partition to store user data;
a first data port for data read access to the boot data partition; and
a second data port for data read access to the user data partition; and
an interface block coupled between the programmable logic portion and the nonvolatile memory portion, the interface block to read data from the user data partition of the nonvolatile memory portion and to write data to the user data partition of the nonvolatile memory, wherein the interface block comprises:
a shift register circuit comprising inputs coupled to the programmable logic array portion;
a data register circuit comprising inputs coupled to the programmable logic array portion, and input and outputs coupled to the nonvolatile memory portion; and
a program/erase control circuit comprising inputs coupled to the programmable logic array portion, and an output coupled to the nonvolatile memory portion.

12. An integrated circuit comprising:
a programmable logic array portion comprising a plurality of logic array blocks configurable to implement user-defined logic functions; and
a nonvolatile memory portion coupled to the programmable logic array portion, wherein the nonvolatile memory portion comprises:
a boot data partition to store configuration data;
a user data partition to store user data;
a first data port for data read access to the boot data partition; and
a second data port for data read access to the user data partition,
wherein the nonvolatile memory portion further comprises:
a first memory cell for storing a first security bit and a second memory cell for storing a second security bit,
wherein when the first security bit is in a first state, data stored in the boot data partition may be transferred through a third data port of the nonvolatile memory portion to pins of the integrated circuit,
when the first security bit is in a second state, data stored in the boot data partition is prevented from being transferred through the third data port to pins of the integrated circuit,
when the second security bit is in a first state, data stored in the user data partition may be transferred through the third port to pins of the integrated circuit, and
when the second security bit is in a second state, data stored in the user data partition is prevented from being transferred through the third port to pins of the integrated circuit.

13. A method of operating an integrated circuit comprising:
enabling a clock enable signal to activate an oscillator coupled to a nonvolatile memory portion of the integrated circuit; and during a normal operation mode, transferring user data stored in a user data partition of the nonvolatile memory portion to a volatile memory portion of a programmable logic array portion of the integrated circuit to be accessed by the programmable logic array portion, wherein a signal provided by the oscillator clocks transfers of the user data from the nonvolatile memory portion to the programmable array portion.

14. The method of claim 13 further comprising:
before entering the normal mode, providing power to the programmable integrated circuit; and
transferring configuration data from the nonvolatile memory portion of the programmable integrated circuit through a read-only port of the nonvolatile memory portion to a programmable logic array portion to configure the programmable logic array portion.

15. The method of claim 13 further comprising:
setting a first security bit to prevent output of the configuration data via pins of the programmable integrated circuit.

16. The method of claim 15 further comprising:
setting a second security bit to prevent output of the data in the user data partition via pins of the programmable integrated circuit.

17. An integrated circuit comprising:
a programmable logic array portion comprising logic array blocks configurable to implement user-defined logic functions;
a nonvolatile memory portion coupled to the programmable logic array portion, wherein the nonvolatile memory portion comprises:
a boot data partition to store configuration data; and
a user data partition to store user data for an operational mode where the user functions are being utilized;
a first memory cell for storing a first security bit, wherein when the first security bit is in a first state, data stored in the boot data partition may be transferred to pins of the integrated circuit, and when the first security bit is in a second state, data stored in the boot data partition is prevented from being transferred to pins of the integrated circuit; and
a second memory cell for storing a second security bit, wherein when the second security bit is in a first state, data stored in the user data partition may be transferred to pins of the integrated circuit, and when the second security bit is in a second state, data stored in the user data partition is prevented from being transferred to pins of the integrated circuit.

18. The integrated circuit of claim 17 wherein the boot data partition is accessible through a first port and the user data partition is accessible though a second port.

19. The integrated circuit of claim 17 further comprising:
an oscillator circuit coupled to the programmable logic array portion and nonvolatile memory portion, wherein the oscillator circuit comprises an enable input for enabling and disabling the oscillator circuit.

20. The integrated circuit of claim 17 wherein the boot data partition is accessible to the programmable logic array portion through the first port and the user data partition is accessible to a user though a second port.

21. The integrated circuit of claim 17 wherein the programmable logic array portion further comprises volatile memory elements and a programmable interconnect, wherein the logic array blocks and programmable interconnect are configurable using the volatile memory elements to implement user functions.

22. The integrated circuit of claim 17 wherein the oscillator circuit is used in clocking data transferred between the programmable logic array portion and the nonvolatile memory portion.

23. The integrated circuit of claim 17 wherein the oscillator circuit is used to clock data transferred within the programmable logic array portion of the integrated circuit.

24. The integrated circuit of claim 17 wherein an output of the oscillator circuit is programmably coupled to a pin of the integrated circuit.

25. An integrated circuit comprising:
a programmable portion;
a nonvolatile memory portion;
a volatile memory portion coupled to the nonvolatile memory portion and the programmable portion, wherein the integrated circuit is configurable by user data stored in the volatile memory portion; and
an oscillator circuit coupled to the volatile memory portion and the nonvolatile memory portion wherein the oscillator circuit comprises an enable input for enabling and disabling the oscillator circuit and wherein a signal provided by the oscillator circuit clocks transfers of the user data from the nonvolatile memory portion to the volatile memory portion.

26. The integrated circuit of claim 25 wherein the programmable portion comprises logic array blocks and programmable interconnect, wherein the logic array blocks and programmable interconnect are configurable using the volatile memory portion.

27. An integrated circuit comprising:
a programmable portion;
a volatile memory portion coupled to the programmable portion;
a nonvolatile memory portion; and
an interface block coupled between the volatile memory portion and the nonvolatile memory portion, the interface block to read user data from and to write user data to the nonvolatile memory, wherein the interface block comprises:
a shift register circuit comprising inputs coupled to the volatile memory portion;
a data register circuit comprising inputs coupled to the volatile memory portion, and input and outputs coupled to the nonvolatile memory portion; and
a program/erase control circuit comprising inputs coupled to the volatile memory portion, and an output coupled to the nonvolatile memory portion.

28. An integrated circuit comprising:
a programmable portion;
a nonvolatile memory comprising a boot data partition to store configuration data for the programmable portion, a user data partition to store user data, a first memory cell for storing a first security bit, a second memory cell for storing a second security bit and a data port,
wherein when the first security bit is in a first state, data stored in the boot data partition may be transferred through the data port to pins of the integrated circuit,
when the first security bit is in a second state, data stored in the boot data partition is prevented from being transferred through the data port to pins of the integrated circuit,
when the second security bit is in a first state, data stored in the user data partition may be transferred through the data port to pins of the integrated circuit, and
when the second security bit is in a second state, data stored in the user data partition is prevented from being transferred through the data port to pins of the integrated circuit.

* * * * *